United States Patent [19]

Ohashi

[11] Patent Number: 4,610,173

[45] Date of Patent: Sep. 9, 1986

[54] PUSH-BUTTON TUNER

[75] Inventor: Tamaki Ohashi, Tokyo, Japan

[73] Assignee: Nihon Technical Kabushiki Kaisha, Tokyo, Japan

[21] Appl. No.: 660,932

[22] Filed: Oct. 15, 1984

[30] Foreign Application Priority Data

Oct. 17, 1983 [JP] Japan .............................. 58-192599

[51] Int. Cl.[4] .................................................. H03J 5/12
[52] U.S. Cl. ........................................ 74/10.33; 334/7
[58] Field of Search ............................ 74/10.33; 334/7

[56] References Cited

FOREIGN PATENT DOCUMENTS 55-27719 2/1980 Japan ...................................... 334/7

Primary Examiner—Allan D. Herrmann
Attorney, Agent, or Firm—Robert E. Burns; Emmanuel J. Lobato; Bruce L. Adams

[57] ABSTRACT

A push-button tuner in which two desired preset broadcasting station frequencies can be selectively tuned in by one push-button comprises a plurality of tuning mechanisms, each of which comprises an operation shaft having a push-button, a pair of tuning shafts respectively disposed on the opposite sides of the operation shaft, and a change-over mechanism for effecting a change-over operation so as to cause the operation member to engage with alternate ones of the pair tuning members in response to alternate reciprocations of the operation member. The push-button tuner comprises a lock plate for holding the tuning shaft in the rear actuation position when it is located in the rear actuation position, and a restriction device for preventing the operation shaft from being urged further rearward when the tuning shaft is held by the lock plate thereby preventing excessive force from being applied to the change-over mechanism.

4 Claims, 6 Drawing Figures

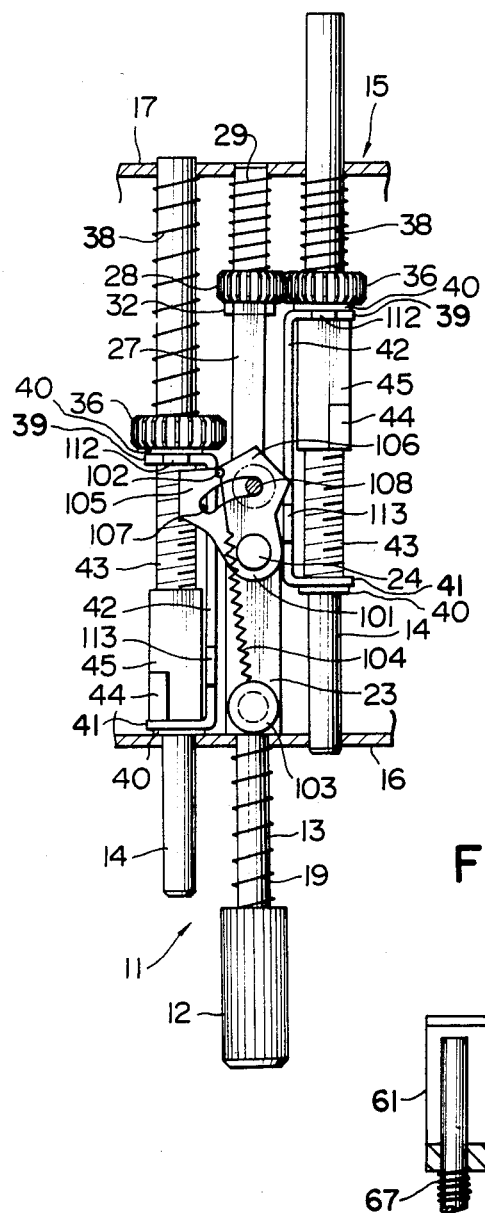
FIG. 2
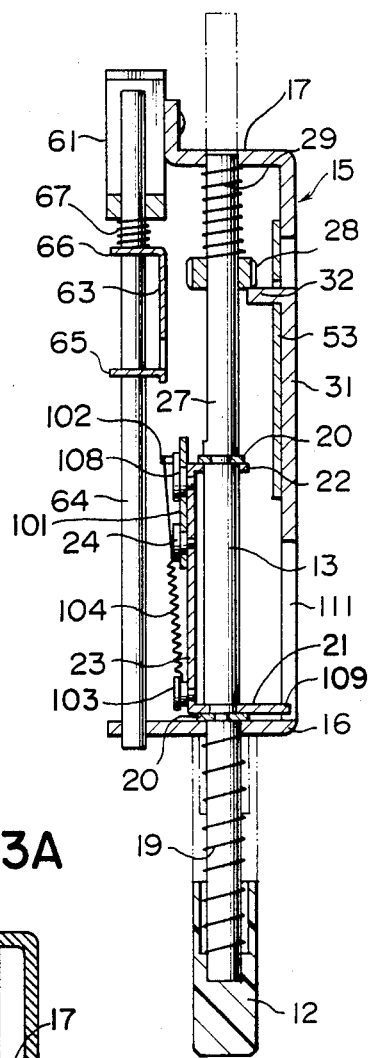
FIG. 3
FIG. 3A

FIG. 4
FIG. 5
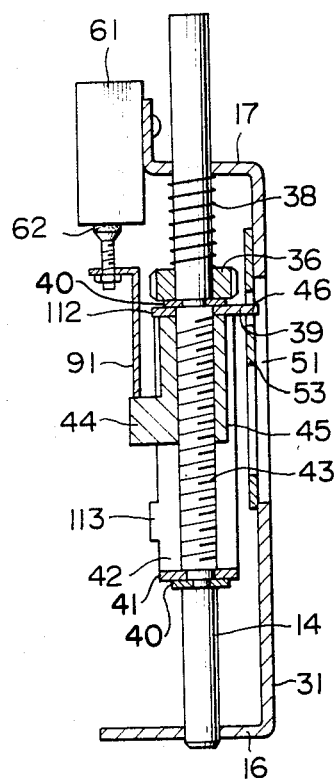
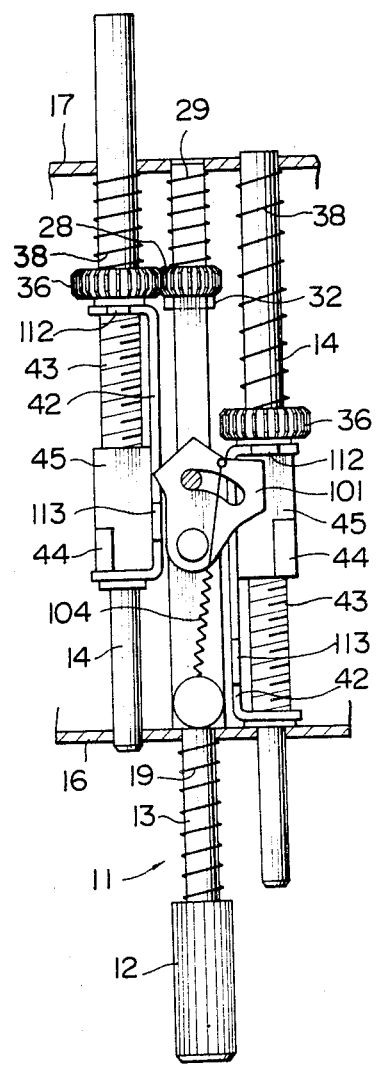

PUSH-BUTTON TUNER

BACKGROUND OF THE INVENTION

1. Field of the Invention

The present invention generally relates to push-button tuners for radio receivers and more particularly to a push-button tuner in which two preset broadcasting frequencies can be selectively tuned in by each push-button.

2. Description of Prior Art

Widely known is a push-button tuner comprising a plurality of push-buttons each of which is set to tune in to a preset broadcasting frequency so that a desired broadcasting frequency is tuned in by depressing a selected one of the push-buttons into its actuated position. In such a push-button tuner, usually, only one broadcasting station could be selected by one push-button so that in order to tune in to a plurality of broadcasting stations by push-buttons, it has been required to provide a plurality of push-buttons corresponding in number to the number of the broadcasting stations. To increase the number of the push-buttons, however, it was necessary to enlarge the size of the tuner per se and thus there was a limit as to the number of broadcasting stations which could be selected by using a small sized tuner.

Accordingly, there has been proposed a push-button tuner in which a pair of adjacent tuning members are provided with each push-button disposed therebetween and the selected one of the tuning members is interlinked with the push-button so that two different broadcasting stations can be selected by each push-button, whereby it is made possible to select a number of broadcasting stations which is two times as large as the number of push-buttons. Such as push-button tuner is disclosed in Japanese Patent Application entitled "Push-button Type Tuner", filed on Aug. 21, 1984, and assigned to the same assignee as the present application. In the disclosed push-button tuner, an operation member provided with a drive gear and a pair of tuning members each provided with a driven gear adapted to mesh with the drive gear are supported on a support in a manner such that these members are rotatable, movable frontward/rearward, and can come back to their initial positions. Each tuning member is formed with a threaded portion where a tuning piece is provided movably frontward/rearward. A change-over mechanism is provided between the operation member and each pair of tuning members for effecting a change-over operation so as to cause the operation member to alternatively engage with alternate ones of the pair of tuning members for each reciprocation of the operation member. In this push-button tuner, the tuning member engaged with the operation member and located at the rear actuation position is held by a lock member supported by the support, and tuning is performed through abutting between the tuning piece and an actuator plate interlinked with a variable tuning element. A presetting operation is performed by adjusting the position of the tuning piece through enagagement between the drive and driven gears.

In such a threaded shaft type push-button tuner, the amount of rearward movement of each of the operation shafts and the tuning members toward the rear actuation position is restricted through the abutting engagement between the tuning member and the support. Accordingly, the pressing force applied on the operation member after the tuning member has been moved rearward through the depressing operation of the operation member and the rearward movement has been restricted by the butting against the support, is received by the change-over mechanism for causing the tuning member to engage with the operation member. Thus, there is such a risk that an excessive mechanical force may be applied to the change-over mechanism to thereby cause damage in the change-over mechanism to make the tuning function incapable.

SUMMARY OF THE INVENTION

An object of the present invention is therefore to provided a push-button tuner in which the above-mentioned disadvantages are eliminated and excessive force is prevented from acting on the change-over mechanism.

According to one aspect of the present invention, the push-button tuner comprises a support, a tuning means mounted on the support in a manner so that the tuning means is movable to positions corresponding to tuned frequencies to producing the tuned frequencies, and a plurality of presettable tuning mechanisms for adjusting the tuning means to move selectively to positions respectively corresponding to specific frequencies. Each of the tuning mechanisms comprises a rotatable operation member movable between a front non-actuation position and a rear actuation position, the operation member being normally urged to the front non-actuation position, the operation member having a drive rotary body and a push-button provided at the front end of the operation member, the push-button being used also as a rotating knob; and a rotatable tuning member having a driven rotary body for selectively engaging with the drive rotary body to rotate together with the drive rotary body, the rotatable tuning member being supported by the support in a manner so that the rotatable tuning member is normally urged to the front non-actuation position while it is movable between the front non-actuation position and the rear actuation position, the rotatable tuning member having a longitudinally extending threaded portion at a part of the surface thereof and a tuning piece engaged with the threaded portion, the tuning piece being movable in the frontward/rearward direction in response to the rotation of the tuning member. The tuning means includes an actuator plate engaging with the tuning piece of the tuning member in the rear actuation position and variable tuning elements provided on the actuator plate; and the push-button tuner further comprises a lock member for holding any one of the tuning members so as to permit the transmission of rotation between the drive rotary body and the driven rotary body when the one tuning member is located in the rear actuation position and for releasing the one tuning member held in the rear actuation position when another tuning member is disposed in the rear actuation position, and comprising a restriction means for restricting further rearward movement of the operation member when the tuning member is moved rearward by the operation member and has reached a position where the tuning member is held by the lock member.

According to a preferred embodiment of the present invention, the restriction means is constituted by an arrangement that the position of the push-button attached to the operation member is adjusted. That is, the push-button is attached to the operation member such that the rear end surface of the push-button abuts on the front surface of the support to thereby prevent the operation member from further rearward moving. Accordingly, the change-over mechanism can be prevented from being deformed by the urging force acting on the operation member. According to the present invention, a high mechanical strength is not required for the change-over mechanism which engages with the tuning member to cause the tuning member to move the latter into the rear actuation position, so that the change-over mechanism can be reduced in size as well as in weight. Thus, the whole of the push-button tuner can be also reduced in size as well as in weight, to make it possible to provide a compact push-button tuner.

The above and other objects, features and advantages of the present invention will be more apparent upon a reading of the following detailed description in conjunction with the accompanying drawings.

BRIEF DESCRIPTION OF THE DRAWINGS

FIG. 2 is a partly cut-away plan view of the tuning mechanism of FIG. 1;

FIG. 3 is a longitudinal sectional view taken on line 3—3 in FIG. 1;

FIG. 4 is a longitudinal sectional view taken on line 4—4 in FIG. 1;

FIG. 5 is a plan view showing the tuning mechanism of FIG. 1 in the operated state.

DETAILED DESCRIPTION OF PREFERRED EMBODIMENTS

Figure 1:
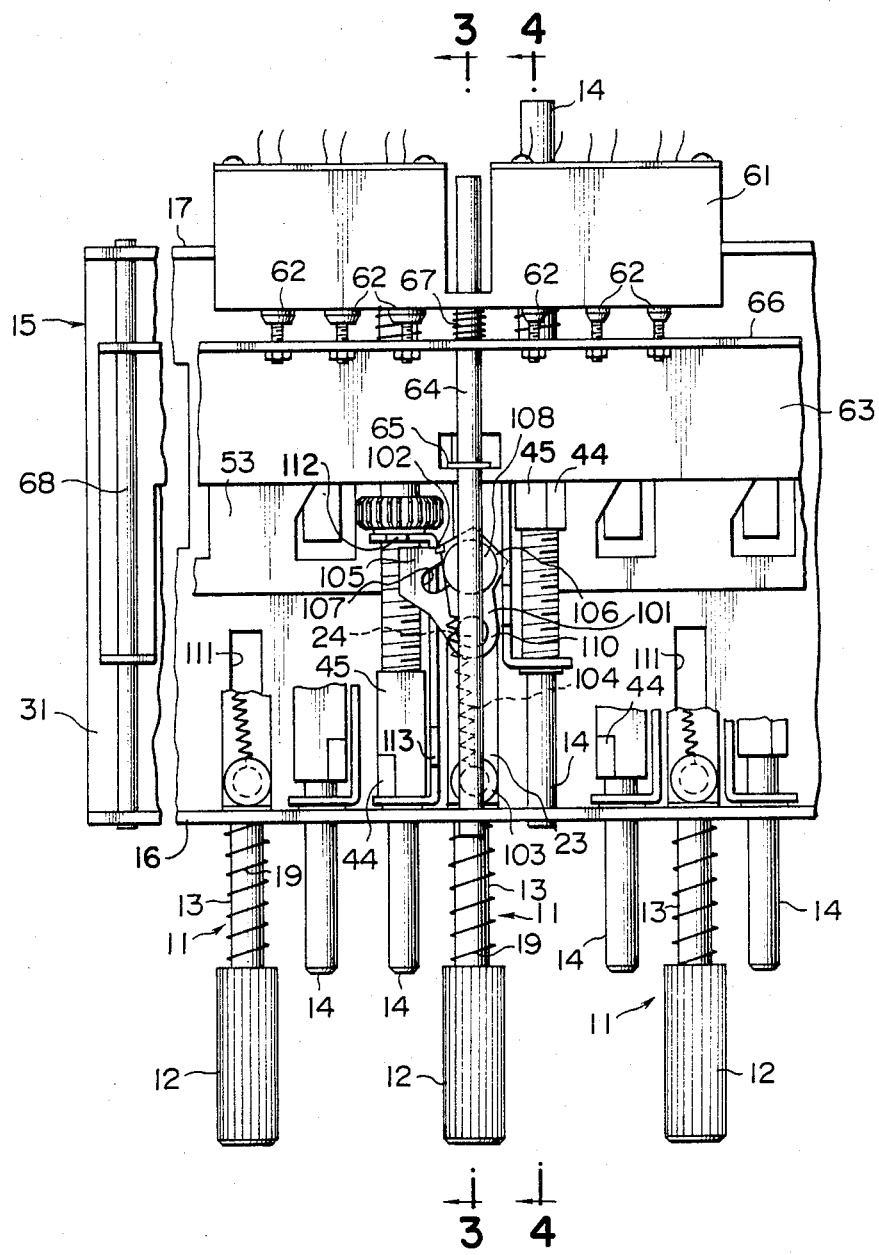
FIG. 1 is a plan view, partly cut-away, showing an embodiment of tuning mechanism according to the present invention.

A preferred embodiment of the push-button tuner according to the present invention will be described hereunder. Although only three tuning mechanisms each having one push-button are illustrated in the drawings, it is understood that all of the tuning mechanisms (including those not shown) have the same construction, and thus only one of the tuning mechanisms is described and illustrated in detail. The tuning mechanism is generally designated by reference numeral 11 and the tuning mechanism 11 has a cylindrical push-button 12 attached at the forward end thereof, an operation shaft 13 attached to the push-button 12, and two tuning shafts 14 and 14 respectively arranged at the opposite sides, that is, the right and and left sides, in the drawing. In the following description, the word "front" is defined as the side of the tuner at which the push-button 12 is attached and the word "rear" is defined as the side at which the push-button 12 is not attached. The respective front and rear portions of the operation shaft 13 and the tuning shafts 14 and 14 are movably inserted into and supported by through holes formed in a front-end and a rear-end rising portion 16 and 17 of a support plate 15.

Figure 6:
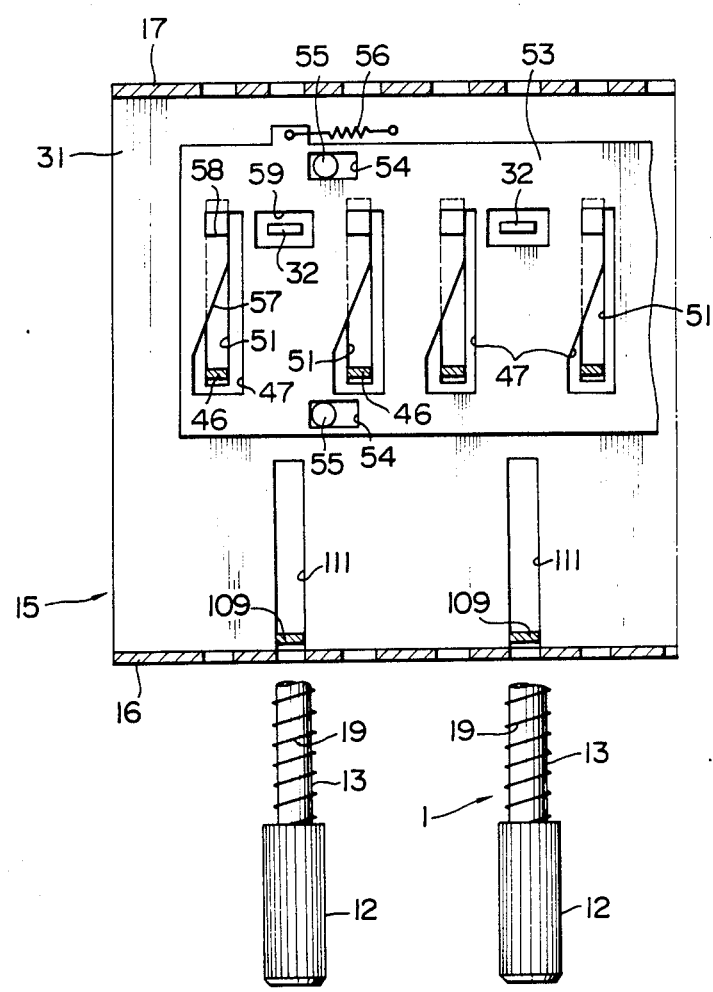
FIG. 6 is a plan view showing the relation between the support plate and the lock plate.

A helical spring 19 for elastically urging the operation shaft 13 in the frontward direction is inserted between the push-button 12 of the operation shaft 13 and the front-end rising portion 16. A support member 23 having bent portions 21 and 22 at its front and rear ends is provided on the operation shaft 13 between the front-end and rear-end portions 16 and 17 such that the operation shaft 13 is inserted through through-holes formed in the bent portions 21 and 22 so as to be supported by the support member 23. This support member 23 is attached to the operation shaft 13 such as by washers 20 in a manner so that it is allowed to move in the rotary direction of the operation shaft 13 but prevented from moving in the axial direction of the operation shaft 13. When the push-button 12 is released from rearward urging, the bent portion 21 of the support member 23 is normally in contact with the rear surface of the front-end rising portion 16 in order to restrict the frontward movement of the operation shaft 13 by the elastic force of the spring 19. A pin 24 is provided at a middle portion of the upper surface of the support member 23 and the front end portion of a change-over lever 101 is pivotally mounted on the pin 24. A pin 102 is planted in the change-over lever 101 at its rear end portion, and a spring 104 is provided between the pin 102 and a pin 103 planted in the support member 23 at its front end portion for applying an elastic tensile force to the change-over lever 101 such that when the rear end of the change-over lever 101 begins to incline or turn in either the leftward or rightward direction with respect to the movement direction of an operation shaft 13, it is caused to further in the same incline direction. The rear end of the change-over lever 101 has a wide width such that a substantially V-shaped pair of tongue portions 105 and 106 are formed thereat. A circularly arced slot 107 is formed in the wide width portion such that it extends across the tongue portions 105 and 106, and a pin 108 planted in the upper surface of the support member 23 is slidably fitted into this slot 107. Thus, the range of pivotal movement of the change-over lever 101 is limited by the cooperation between the pin 108 and the slot 107 so that the change-over lever 101 can be alternately pivoted between two working positions. The end portion 109 of the front bent portion 21 of the support member 23 is slidably fitted into a guide hole 111 formed in a bottom plate 31 of the support plate 15. The guide hole 111 extends in the direction of movement of the operation shaft 13 and guides the frontward/rearward sliding of the support member 23. A rear portion 27 of the operation shaft 13 is axially partly cut away so as to make the cross-section non-circular, and a drive gear 28 is fitted onto this non-circular portion such that it is allowed to slide in the axial direction of the operation shaft 13 while prevented from sliding in the rotary direction of the same. A helical spring 29 is mounted on the operation shaft 13 between the drive gear 28 and the rear-end rising portion 17 so as to always elastically frontward urge the drive gear 28. The other surface of the drive gear 28 opposite to the surface contacting with the helical spring 29 abuts on a restriction portion 32 which is formed by bending over the bottom plate 31 of the support plate 15 so as to restrict the movement of the drive gear 28 in the axial direction of the operation shaft 13. The pair of tuning shafts 14 and 14 cooperating with the operation shaft 13 have the same structure and, therefore, a description will be given about one of the tuning shafts 14, while as to the other tuning shaft 14 the same portions as those of the one tuning shaft 14 are designated by the same reference numerals and the explanation thereabout is omitted here. The tuning shaft 14 is circumferentially rotatably and axially slidably supported at its front and rear portions by the front-end and rear-end rising portions 16 and 17 of the support plate 15. A driven gear 36 having a diameter larger than that of the drive gear 28 is mounted on the tuning shaft 14 at its rear portion. A helical spring 38 is mounted on the tuning shaft 14 between the driven gear 36 and the rear-end rising portion 17 for always frontward urging the tuning shaft 14. A guide member 42 having bent portions 39 and 41 at its opposite ends is mounted on the tuning shaft 14 between the driven gear 36 and the front-end rising portion 16 such that the surface of the guide member 42 between its opposite bent portions 39 and 41 is perpendicular to the surface of the bottom plate 31 of the support plate 15 and that the guide member 42 is angularly swingable but prevented from axially moving by washers 40. That is, the tuning shaft 14 is loosely passed through through holes (not shown) formed in the respective bent portions 39 and 41. An engagement/stopper portion 112 is formed at an upper end center of the rear bent portion 39 of the guide member 42 of each tuning shaft 14 so as to cooperate with the change-over shaft 14 to cause the tuning shaft 14 to move rearward. This engagement/stopper portion 112 engages with the front edge of the tongue portion 105 or 106 of the change-over lever 101 so as to cause the tuning shaft 14 to advance in the same direction as the operation shaft 13 when the operation shaft 13 is advanced to the rearward-displaced position. A protrusion 113 is formed in the front side-edge upper surface of the guide member 42. This protrusion 113 engages with the rear edge of one of the tongue portions 105 and 106 of the change-over lever 101 to pivot the change-over lever 101 to the other working position. A threaded portion 43 is formed at the outer periphery of the tuning shaft 14 within the guide member 42, and a tuning piece 45 provided at its upper surface with an upward projecting memory protrusion 44 is engaged with the threaded portion 43. A protrusion 46 is formed at the lower portion of the rear bent portion 39 of the guide member 42 (FIGS. 4 and 6).

A lock plate 53 is provided movably perpendicularly to the operation shaft 13 on the rear portion of the bottom plate 31 of the support plate 15. Longitudinally elongated holes 54 are formed in the longitudinally opposite ends of the lock plate 53, and pins 55 respectively planted in the bottom plate 31 are fitted in the elongated holes 54 so as to restrain the amount of movement of the lock plate 53 in the left-right direction. One and the other ends of a spring 56 are attached to the bottom plate 31 and the lock plate 53, respectively, so as to elastically bias the lock plate 53 rightward in FIG. 1. A cam opening 47 engaging with the protrusion of the guide member 42 is formed in the lock plate 53 as shown in detail in FIG. 6. The cam opening 47 is provided with a slant edge 57 which engages with the protrusion 46 when the tuning shaft 14 comes rearward to temporarily cause the lock plate 53 to move left in FIG. 6 against the force of the spring 56, and an engagement/stopper step portion 58 formed behind the edge 57 for engaging with and stopping the protrusion 46. A guide slot 51, into which the end of the protrusion 46 is fitted, is formed in the bottom plate 31 of the support plate 15 corresponding to this cam opening 47, the guide slot 51 extending in the axial direction of the tuning shaft 14. The guide slot 51 is provided for preventing the guide member 42 from rotating together with the tuning shaft 14 when the latter rotates and for guiding the frontward/rearward movement of the guide member 42. Elongated holes 59 extending in the left-to-right direction similarly to the elongated holes are formed in the lock plate 53 at positions corresponding to the restriction portions 32 for the operation shaft 13, the respective restriction portions being upward projected through the elongated holes 59.

As a variable tuning means 61 for selecting a desired frequency, employed is a well known device of the telescopic type in which the position of each of a plurality of magnetic cores 62 is adjusted, and the detailed description thereof is omitted here. The tip end of each of the magnetic cores 62 of the variable tuning means 61 is attached to an actuator plate 63. The actuator plate 63 extends laterally in FIG. 1 to cover all the tuning shafts 14. At a center portion of the actuator plate 63, a support rod 64 extends perpendicularly to the longitudinal direction of the actuator plate 63. The support rod 64 is fitted in and fixed to a rear-end rising portion 65 formed by cutting and bending up a portion of the actuator plate 63 and a rear-end rising portion 66 of the actuator plate 63 supporting the tip ends of the respective magnetic cores 62. The front end of the support rod 64 is slidably supported by the front-end rising portion 16 of the support plate 15 and the rear end of the same is also slidably supported by the variable tuning means 61. A spring 67 for returning the actuator plate 63 is mounted on the support rod 64 at its portion between the rear-end rising portion 66 and the variable tuning means 61. The longitudinally opposite ends of the actuator plate 63 are slidably supported by a guide rod 68 extending parallelly with the support rod 64. The opposite ends of the guide rod 68 are fixedly supported by the front-end rising portion 16 and the rear-end rising portion 17 of the support plate 15. The rear end of the variable tuning means 61 is fixedly supported on a support surface 69 formed by horizontally bent the upper end portion of the rear-end rising portion 17 of the support plate 15, through screws 71.

In FIG. 1, the tuning shaft 14 located at the right side of the center one of the operation shafts 13 has moved rearward and the protrusion 46 is engaging with the engagement/stopper step portion 58 of the lock plate 53 so that the central tuning mechanism 11 is maintained in its retreated state. The operation shaft 13, the guide member 42 of the right-hand tuning shaft 14 and the left-hand tuning shaft 14 are in their returned state. Assume that, at that time, the change-over lever 101 has been rotated in the counterclockwise direction to the state shown in FIG. 2. When the push-button 12 is turned in this state, the right-hand tuning shaft 14 rotates because the drive gear 28 meshes with the driven gear 36. The turning of the tuning shaft 14 causes the tuning piece 45 to move in the rearward/frontward direction on the tuning shaft 14. The side surface of the tuning piece 45 is in contact with the vertical side surface of the guide member 42 so that the tuning piece 45 can move without turning. The top of the memory protrusion 44 of the tuning piece 45 is in contact with the front edge of the actuator rod 64 so that the actuator rod 64 moves against the elastic force of a spring 56 as the tuning piece 45 moves. Consequently, the variable tuning means 61 is varied so that a desired radio station can be tuned in. After tuning, the selection of the desired radio station is fixed and memorized until the operation shaft 13 is rotated again.

Thus, after the desired radio station has been memorized in the right-hand tuning shaft 14 by means of the movement stroke of the tuning piece 45, the push-button 12 is depressed again. Thus, the rear edge of the left-hand tongue portion 105 of the change-over lever 101 abuts on the engagement/stopper portion 112 of the guide member 42 of the left-hand tuning shaft 14 to displace the tuning shaft 14 rearward. The protrusion 46 of the guide member 42 moves rearward together with the tuning shaft 14 and engages with the ramp edge 57 to cause the lock plate 53 to move left in FIG. 1. Thus, the engagement between the protrusion 46 of the guide member of the right-hand tuning shaft 14 and the engagement/stopper stepped portion 58 of the cam opening 47 is released so that the right-hand tuning shaft 14 is caused to come back frontward by the spring 38. The protrusion 46 of the guide member 42 of the left-hand tuning shaft 14 reaches the engagement/stopper stepped portion 58 from the slant edge 57 and becomes locked by this engagement/stopper stepped portion 58. Turning of the push-button 12 in this state will cause turning of the left-hand tuning shaft 14 to tune the variable tuning means 61 to a desired radio station in the same manner as described with reference to the right-hand tuning shaft 14. If the push-button 12 is released from depression in this state, the operation shaft 13 is caused to return by the spring 29. In this returning operation, the front edge of the tongue portion 105 of the change-over lever 101 butts against the protrusion 113 of the left-hand tuning shaft 14 to cause the change-over lever 101 to rotate clockwise. At this time, if an imaginary line connecting the pins 24 and 102 of the change-over lever 101 inclines to the right even a slight amount, the change-over lever is caused by the spring 104 to rotate right to the extremity allowed by the slot 107 and the pin 108. Thus, the change-over lever 101 is alternately pivoted or swung clockwise and counterclockwise by the butting action every reciprocation of the operation shaft 13.

The rearward moving stroke of the push-button 12 is restricted by the abutting of the rear end surface of the push-button 12 onto the front surface of the front-end rising portion 16 of the support plate 15 as shown with a two-dots chain line in FIG. 3. That is, the distance between the rear end surface of the push-button 12 in its returned state and the front surface of the front-end rising portion 16 of the actuator plate 15 is set to be equal to or slightly longer than the distance along which the protrusion 46 of the tuning shaft 14 pushes the push-button 12 from its returned position to a position at which the protrusion 46 engages with the engagement/stopper step portion 58 of the lock plate 53. Thus, when the push-button 12 is pushed rearward and the protrusion 46 engages with the engagement/stopper step portion 58 of the lock plate 53, the rear end surface of the push-button 12 abuts on the front surface of the front-end rising portion 16 of the support plate 15, so that the push-button 12 is prevented from further moving rearward beyond necessity. Accordingly, no excessive force acts on the change-over lever 101 other than the force to cause the change-over lever 101 to move rearward against the elastic force of the spring 38 and the spring 56 of the lock plate 53, so that the the change-over lever 101 is not deformed even though it is constituted by a piece of thin plate.

Alternatively, as shown in FIG. 3A, the restriction of the amount of rearward movement of the push-button 12 may be performed by providing a rear portion restriction member 72 so as to perform the restriction by the rear end of the operation shaft 13. The rear portion restriction member 72 is arranged such that one end thereof is supported by the rear-end rising portion 17 and the other end is laterally bent. The distance between the abutting surface of the rear portion restriction member 72 and the rear-end rising portion 17 is equal to the distance between the rear end surface of the push-button 12 and the front surface of the front-end rising portion 16. In such an arrangement, the mounting position of the push-button 12 relative to the operation member 13 is independent of the distance.

What is claimed is:

1. A push-button tuner comprising:
    a support, tuning means mounted on said support in a manner so that said tuning means is movable to positions corresponding to tuned frequencies for producing the tuned frequencies, and a plurality of presettable tuning mechanisms for adjusting said tuning means to move selectively to positions respectively corresponding to specific frequencies, in which each of said tuning mechanisms comprises:
    a rotatable operation member movable between a front non-actuation position and a rear actuation position, said operation member being normally urged to said front non-actuation position, said operation member having a drive rotary body and a push-button provided at the front end thereof, said push-button defining at its front end a rotating knob for effecting rotation of said operation member; and
    a rotatable tuning member having a driven rotary body for selectively engaging with said drive rotary body to rotate together with said drive rotary body, said rotatable tuning member being supported by said support in a manner so that said rotatable tuning member is normally urged to said front non-actuation position while it is movable between said front non-actuation position and said rear actuation position, said rotatable tuning member having a longitudinally extending threaded portion and a tuning piece threadedly engaged with said threaded portion, said tuning piece being movable in the frontward and rearward directions in response to and according to the direction of rotation of said tuning member;
    said tuning means including an actuator plate engaging with said tuning piece of each said tuning member when the same is in said rear actuation position to enable adjusting of said tuning means, and variable tuning elements provided on said actuator plate; and
    said push-button tuner further comprising locking means including a lock member for holding any one of said tuning members so as to permit the transmission of rotation between said drive rotary body and said driven rotary body when said one tuning member is located in said rear actuation position and for releasing said one tuning member held in said rear actuation position when another tuning member is displaced to said rear actuation position, and restriction means for restricting further rearward movement of said operation member when said one tuning member is moved rearward by said operation member and has reached a position where said tuning member is held by said lock member.

2. A push-button tuner according to claim 1, in which said restriction means is constituted by said push-button attached to said operation member and being dimensioned such that the rear end surface of said push-button abuts on the front surface of said support when said tuning member has reached a position where said tuning member is held by said lock member.

3. A push-button tuner according to claim 1, in which said restriction means is constituted by a restriction plate provided on said support and being dimensioned such that the rear end surface of said operation member abuts on said restriction plate when said tuning member has reached a position where said tuning member is held by said lock member.

4. A push-button tuner according to claim 1, in which said lock member is supported by said support movably in the direction perpendicular to the moving direction of said tuning member and elastically biased in one of two opposite directions along said perpendicular direction, said lock member being provided with a slant cam for moving said lock member in the other of said two opposite directions against an elastically biasing force acting thereto in response to the movement of said tuning member to said rear actuation position, and an engagement/stopper step portion formed at a portion following said slant cam for holding said tuning member in said rear actuation position, each said tuning member having an engagement member for engaging with said slant cam.

* * * * *